US008081039B1

(12) United States Patent
Venca et al.

(10) Patent No.: US 8,081,039 B1
(45) Date of Patent: Dec. 20, 2011

(54) HIGH EFFICIENCY HARMONIC VOLTAGE CONTROLLED OSCILLATOR (VCO)

(75) Inventors: Alessandro Venca, Tortona (IT); Enrico Sacchi, Pavia (IT); Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 12 days.

(21) Appl. No.: 12/793,309

(22) Filed: Jun. 3, 2010

Related U.S. Application Data (60) Provisional application No. 61/183,854, filed on Jun. 3, 2009.

(51) Int. Cl.
*H03B 5/12* (2006.01)

(52) U.S. Cl. ............ 331/117 FE; 331/113 R; 331/185

(58) Field of Classification Search .......... 331/113 R, 331/117 FE, 117 R, 167, 185
See application file for complete search history.

(56) References Cited

U.S. PATENT DOCUMENTS

| 6,016,082 | A  | * | 1/2000  | Cruz et al. ............ 331/117 FE |
| 6,700,451 | B1 | * | 3/2004  | Peckham et al. ....... 331/117 FE |
| 6,956,443 | B2 | * | 10/2005 | Ruffieux .................... 331/158 |
| 7,737,797 | B2 | * | 6/2010  | Shen ...................... 331/117 R |

OTHER PUBLICATIONS

Hajimiri et al., "A General Theory of Phase Noise in Electrical Oscillators", IEEE Journal of Solid-State Circuits, vol. 33, No. 2, Feb. 1998.
Hajimiri et al., "Corrections to a General Theory of Phase Noise in Electrical Oscillators", IEEE Journal of Solid-State Circuits, vol. 33, No. 6, Jun. 1998.
Mazzanti et al., "Class-C Harmonic CMOS VCOs, With a General Result on Phase Noise", IEEE Journal of Solid-State Circuits, vol. 43, No. 12, Dec. 2008.

* cited by examiner

*Primary Examiner* — Robert Pascal
*Assistant Examiner* — Levi Gannon (57) ABSTRACT

In one embodiment, a voltage controlled oscillator (VCO) is provided. The VCO includes a tank circuit. Also, the VCO includes a first pair of transistors. The drains of the first pair of transistors are coupled to the tank circuit and the gates of the first pair of transistors are cross-coupled with the drains of the first pair of transistors. The first pair of transistors each have a first threshold voltage. The VCO further includes a second pair of transistors. The drains of the second pair of transistors are respectively coupled to the sources of the first pair of transistors and the gates of the second pair of transistors are respectively coupled to the gates of the first pair of transistors. The second pair of transistors each have a second threshold voltage higher than the first threshold voltage.

12 Claims, 7 Drawing Sheets

HIGH EFFICIENCY HARMONIC VOLTAGE CONTROLLED OSCILLATOR (VCO)

CROSS REFERENCE TO RELATED APPLICATIONS

The present application claims priority to U.S. Provisional App. No. 61/183,854 for "High Efficiency Harmonic VCO" filed Jun. 3, 2009, the contents of which is incorporated herein by reference in their entirety.

BACKGROUND

Particular embodiments generally relate to voltage control oscillators (VCOs).

Unless otherwise indicated herein, the approaches described in this section are not prior art to the claims in this application and are not admitted to be prior art by inclusion in this section.

Figure 1:
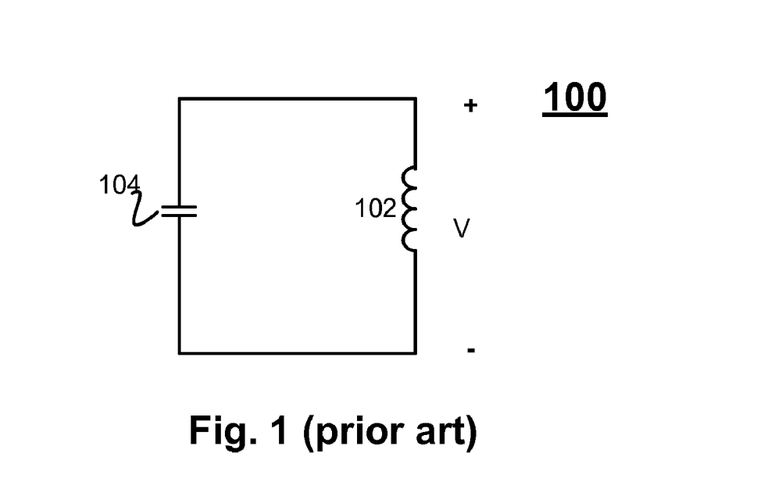
FIG. 1 depicts a conventional Inductor/capacitor tank oscillator.

FIG. 1 depicts a conventional inductor/capacitor tank (LC tank) 100. LC tank 100 is formed by a parallel or series connection of an inductor 102 and a capacitor 104.

In operation, for a resonant frequency, the impedance of LC-tank 100 becomes infinite and when energy is stored initially in the tank, it circulates from voltage energy in capacitor 104 ($\frac{1}{2}Cv^2$) to current energy in inductor 102 ($\frac{1}{2}Li^2$), and vice versa. This exchange of energy occurs at the resonant frequency $$(1/2\pi\sqrt{LC}),$$

with the voltage and current being sinusoidal in quadrature phase with respect to each other and the ratio of the voltage and current amplitude being $$V_0/I_0 = \sqrt{LC}.$$

Figure 2:
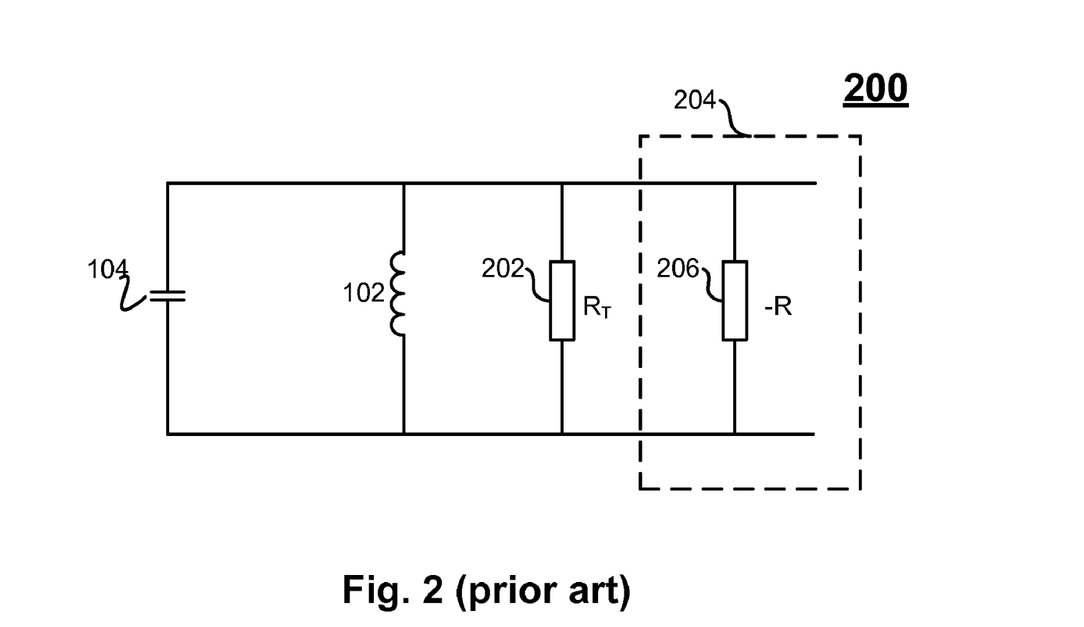
FIG. 2 depicts a conventional voltage controlled oscillator.

Reactive components, such as inductor 102 and capacitor 104, have losses in the real world implementation. The losses may be modeled as series or parallel resistances to LC-tank 100. An active circuit may be used to compensate for the losses. FIG. 2 depicts a conventional voltage controlled oscillator 200. The losses of LC-tank 100 are modeled as a resistance (RT) 202. The effect of the losses takes away energy from LC-tank 100, which dampens the oscillation making it fade away in time. Also, the losses are resistive in nature and generate noise that is usually represented as two orthogonal noise components: amplitude noise modulation (AM) and phase noise modulation (PM). The combination of these two orthogonal noise components and the sensitivity of the phase of oscillator 200 to these noise components results in phase noise around the resonance frequency, which degrades the spectral purity.

Regarding PM noise, the phase noise L in harmonic oscillators at an offset frequency $\Delta\omega$ from the carrier can be expressed as:

$$L(\Delta\omega) = 10 \cdot \log\left(\frac{\sum_i N_{L,i}}{2\Delta\omega^2 C^2 A^2}\right),$$

where A is the voltage oscillation amplitude across LC tank 100, C is LC tank capacitance, and, for white noise sources, $N_{L,1}$, is given by:

$$N_{L,i} = \frac{1}{T_0}\int_0^{T_0} \Gamma^2(t) \cdot \overline{i_{n,i}^2(t)}\,dt,$$

where T0 is the oscillation period, $\overline{i_{n,i}^2(t)}$ is the white current noise power spectral density produced by the $i_{th}$ device, and $\Gamma_i$ is the corresponding Impulse Sensitivity Function (ISF), representing the time-dependent sensitivity of the phase of the oscillation to $i_{n,i}$.

In VCOs, the ISF of the current noise sources in parallel to LC tank 100 may be a sinusoid in quadrature with the LC tank voltage, i.e., the VCO's phase noise sensitivity to these parallel current noise sources is max at the LC tank voltage zero crossing and minimum at the tank voltage peaks.

An active circuit 204 in oscillator 200 compensates for the losses by introducing a negative resistance (−R) 206 to sustain the oscillation at a desired frequency. However, active circuit 204 introduces noise that contributes to the total phase noise of oscillator 200.

Figure 3:
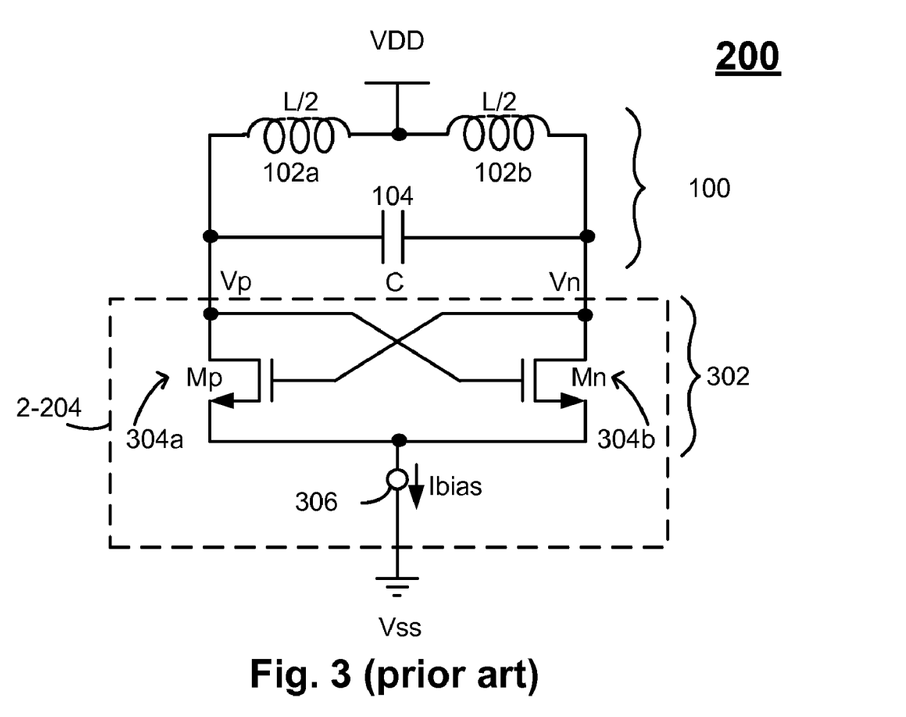
FIG. 3 depicts a more detailed example of the conventional voltage controlled oscillator.

FIG. 3 depicts a more detailed example of a conventional voltage controlled oscillator 200. LC-tank 100 (inductors 102a and 102b, and capacitor 104) is coupled to active circuit 204, which is represented as a cross-coupled transistor pair 302. Cross-coupled transistor pair 302 synthesizes negative resistance 206. As shown, cross-coupled transistor pair 302 is coupled in parallel to LC-tank 100 and includes a first transistor 304a (Mp) and a second transistor 304b (Mn).

The negative resistance synthesized by cross coupled transistor pair 302 is explained by describing the currents sourced/sinked by cross-coupled transistor pair 302 to/away from LC-tank 100. The current sourced/sinked is provided by a current source (Ibias) 306. When a voltage at a node Vp is at its positive peak value, a resistance RT 202 shown in FIG. 2 is taking away current from the node Vp. To compensate for this, transistor 304a is sourcing current into node Vp. When the voltage at node Vp is at its negative peak value, the resistance RT 202 of FIG. 2 is sourcing current into node Vp and transistor 304a is sinking current from node Vp. The dual behavior also happens at node Vn.

Cross-coupled transistor pair 302 is behaving as a negative resistance because cross-coupled transistor pair 302 is sourcing current from nodes Vp or Vn when the voltage is at a maximum at the nodes and sinking current from nodes Vp or Vn when the voltage is at a minimum at the nodes. The ratio between the voltage at nodes Vp or Vn to the current flowing out of nodes Vp or Vn is negative.

Figure 4:
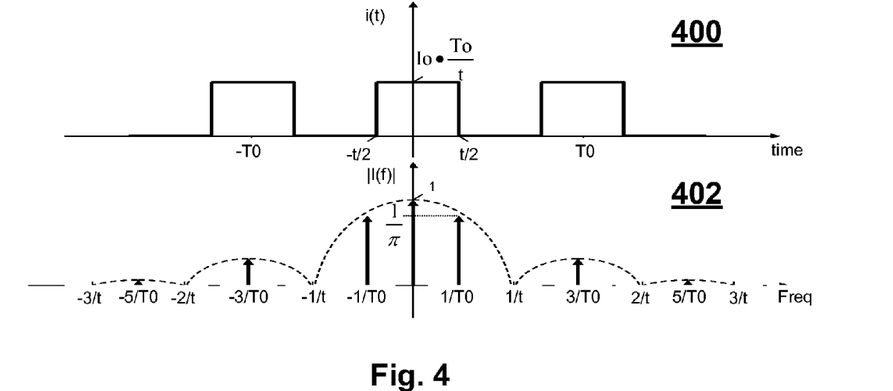
FIG. 4 shows a graph of an example of a square wave current delivered by a cross-coupled transistor pair.

The current delivered to LC-tank 100 by cross-coupled transistor pair 302 has a square-like shape and a period of $1/(2\pi\omega_0)$. FIG. 4 shows a graph 400 of an example of a square wave current delivered by cross-coupled transistor pair 302. The spectral content, which includes the fundamental frequency plus higher order harmonics, is filtered by a sinc function. A graph 402 shows a frequency representation for the square wave current. For a 50% duty cycle of the square wave current that is delivered to LC-tank 100, the ratio between the current component delivered to LC-tank 100 at the fundamental frequency ($I\omega_0$) and the current delivered by current source 306 is calculated as follows:

$$Ibias = I_0$$

$$I\omega_0 = \sqrt{\left(\frac{I_0}{\pi} \cdot \sin\frac{\pi}{2}\right)^2 + \left(\frac{I_0}{\pi} \cdot \sin\frac{\pi}{2}\right)^2} = \sqrt{\left(\frac{I_0}{\pi}\right)^2 + \left(\frac{I_0}{\pi}\right)^2} = \frac{2I_0}{\pi}$$

$$\frac{I\omega_0}{Ibias} = \frac{2}{\pi}$$

Only energy associated with the fundamental frequency contributes to the compensation of the resistance losses RT 202. From this, an intrinsic efficiency reduction factor of $2/\pi$ or $-3.9$ dB results.

SUMMARY

In one embodiment, a voltage controlled oscillator (VCO) is provided. The VCO includes a tank circuit. Also, the VCO includes a first pair of transistors each having a gate, drain, and a source. The drains of the first pair of transistors are coupled to the tank circuit and the gates of the first pair of transistors are cross-coupled with the drains of the first pair of transistors. The first pair of transistors each have a first threshold voltage. The VCO further includes a second pair of transistors each having a gate, drain, and a source. The drains of the second pair of transistors are respectively coupled to the sources of the first pair of transistors and the gates of the second pair of transistors are respectively coupled to the gates of the first pair of transistors. The second pair of transistors each have a second threshold voltage higher than the first threshold voltage.

In one embodiment, at substantially around a zero crossing of a voltage waveform of the tank circuit, the first pair of transistors are on and the second pair of transistors are off.

In one embodiment, a first bias voltage circuit is coupled to the gate of a first transistor of the first pair of transistors and the gate of a first transistor of the second pair of transistors. Also, a second bias voltage circuit is coupled to the gate of a second transistor of the first pair of transistors and the gate of a second transistor of the second pair of transistors.

In one embodiment, the first bias voltage circuit and the second bias voltage circuit shift a bias voltage for the second pair of transistors such that the second threshold voltage is higher than the first threshold voltage.

The following detailed description and accompanying drawings provide a better understanding of the nature and advantages of the present invention.

DETAILED DESCRIPTION

Described herein are techniques for a voltage controlled oscillator (VCO). In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 5:
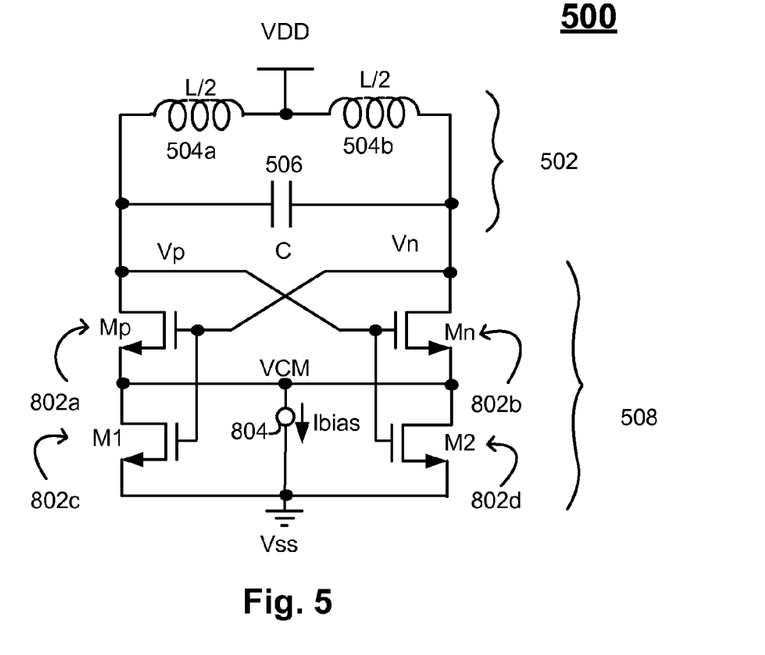
FIG. 5 depicts an example of a voltage-controlled oscillator (VCO) according to one embodiment.

FIG. 5 depicts an example of a voltage-controlled oscillator (VCO) 500 according to one embodiment. Further details of FIG. 5 will be described below. VCO 500 includes an LC-tank 502 and an active circuit 508. LC-tank 502 includes an inductor (L) 504 and a capacitor (C) 506.

Active circuit 508 compensates for losses in LC-tank 502 by introducing a negative resistance to sustain oscillation of an output signal of VCO 500 at a desired frequency. Particular embodiments increase the efficiency of VCO 500. For example, a current introduced into LC-tank 502 is a pulse-like current in which the duty cycle is reduced towards 0%. Additionally, the current is introduced in phase with a voltage waveform of LC tank 502 to increase the efficiency of VCO 500.

The introduction of a pulse-like current with a duty cycle approaching 0% will first be described. The pulse duration of the current introduced into LC-tank 502 is decreased while increasing the current's peak value to keep the DC current consumption constant. If the duty cycle is 50% conventionally, particular embodiments may reduce the duty cycle below 50% towards 0%.

Figure 6A:
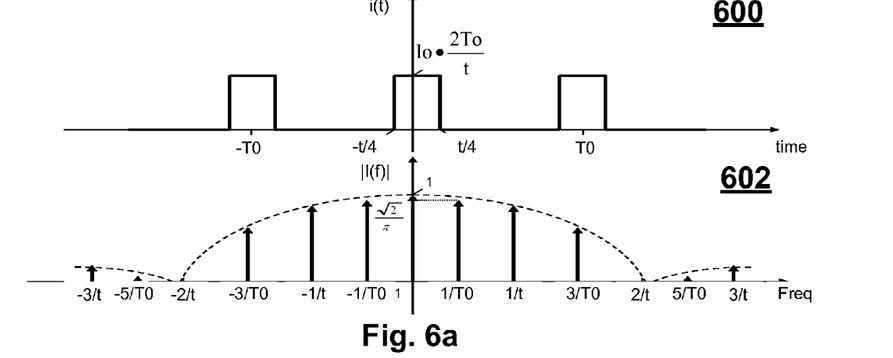
FIG. 6a depicts a graph of a current waveform and a graph of a frequency representation of the current waveform according to one embodiment.

Reducing the duty cycle makes sinc filtering on a first harmonic less pronounced. FIG. 6a depicts a graph 600 of a current waveform and a graph 602 of a frequency representation of the current waveform according to one embodiment. Graph 600 shows a pulse-like waveform that has a duty cycle of 25%. As shown, the amplitude is $$I_0 \cdot \frac{2T_o}{t},$$

which is larger than the amplitude $$I_0 \cdot \frac{T_o}{t}$$

of the conventional square wave current of FIG. 4. Thus, the duty cycle has been decreased from the square wave current of FIG. 4 and the amplitude has been increased.

Reducing the duty cycle causes the spectrum of the frequency representation shown in graph 602 to flatten out with respect to the conventional spectrum shown in graph 402 of FIG. 4. That is, the sinc filtering on a first harmonic at $1/T_0$ becomes less pronounced. For example, a ratio of the harmonic at the zero frequency, which is the DC current dissipated, to the first harmonic at the fundamental frequency in FIG. 6a is less than the ratio shown in FIG. 4 for the conventional 50% duty cycle. For example, the ratio in graph 602 is $$\frac{\sqrt{2}}{\pi}$$

while the ratio for the conventional 50% duty cycle square wave 402 is $$\frac{\sqrt{1}}{\pi}.$$

This improves the efficiency of VCO 500 because the ratio is smaller between the DC current dissipated and the current delivered to LC tank 502. The first harmonic is used to compensate for the losses in LC-tank 502. If the ratio of the first harmonic to the DC current is maximized, then the efficiency of VCO 500 is increased. That is, the current introduced into LC-tank 502 compensates for the losses more efficiently.

Higher order harmonics (i.e., higher than the first harmonic) of the current delivered to LC-tank 500 may be neglected because they are filtered by the low impedance of LC-tank 502 at those frequencies producing low voltage high order harmonics and hence do not contribute significantly to the energy balance in LC-tank 502. The higher frequency harmonics do not dissipate any significant energy.

Figure 6B:
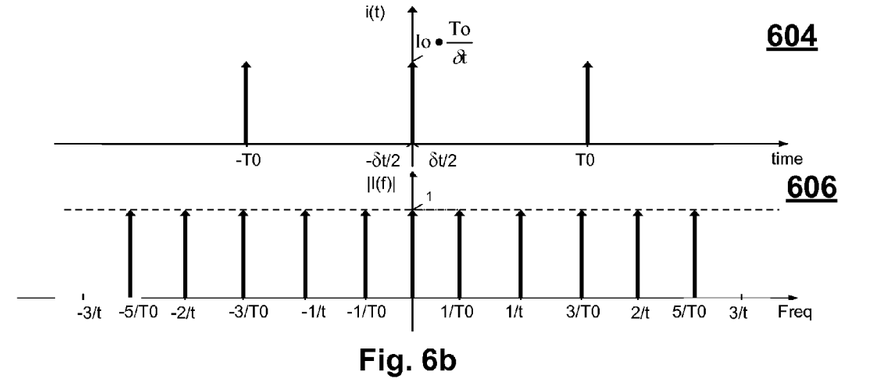
FIG. 6b shows a graph of the current waveform and a graph of a frequency representation of the current waveform according to one embodiment.

The efficiency as the duty cycle goes to 0% may be improved by a factor of $2/\pi$ when the current is an ideal train of pulses at the resonating frequency. FIG. 6b shows a graph 604 of the current waveform and a graph 606 of a frequency representation of the current waveform according to one embodiment. The current waveform is a train of pulses of the amplitude $$I_0 \cdot \frac{T_0}{\delta t},$$

which is a 0% duty cycle. This translates into a ratio of 1 between the harmonic at the zero frequency and the first harmonic at the fundamental frequency.

Accordingly, the ratio between the current delivered to LC-tank 502 at the fundamental frequency ($I\omega_0$) and the current delivered by VCO 500 is increased by injecting a pulse-like current with a duty cycle going towards 0% into LC-tank 502. A train of narrow pulses with a period equal to $1/(2/\pi 107_0)$ may be used. In a limit case of a 0% duty cycle (e.g., train of Dirac's delta) the ratio between the DC current and the current at the fundamental frequency can be increased by a factor of $1/(2/\pi)$.

Particular embodiments also deliver a positive current into LC-tank 502 that is in phase with the voltage waveform of LC-tank 502. For example, the current at the fundamental frequency ($I\omega_0$) is delivered by active circuit 508 in phase with the voltage across LC-tank 502 at the resonating frequency ($V\omega_0$).

Particular embodiments deliver current to LC-tank 502 at the fundamental frequency to compensate for the energy lost on the real part of the resistance of LC-tank 502. The energy delivered to LC-tank 502 is calculated as the product of the current component from active circuit 508 times the voltage component across LC-tank 502 at the fundamental frequency:

$$E\omega_0 = I\omega_0 \cdot V\omega_0.$$

The above equation is the product of two complex quantities (phasors) that includes the magnitude and also the relative phase of two complex numbers. Both the magnitude and phase should be taken into account as to how to inject the current into LC-tank 502.

Particular embodiments inject the current with a relative phase of 0 with respect to the voltage of LC-tank 502. If the relative phase is: $\Phi(V\omega_0) - \Phi(I\omega_0) = 0$, then the current delivered by active circuit 508 is a pure reduction of loss and represents a negative resistance, which is desired to compensate for the losses of LC-tank 502. The impedance that is in parallel to LC-tank 502 can be modeled as:

$$Zactive = -\frac{V\omega_0}{I\omega_0} + j0.$$

The above represents a pure negative resistance and indicates that the current pulse should be injected in phase with the voltage if the pure negative resistance is desired.

If the current is delivered out of phase, such as 180° or 90° out of phase, the energy delivered does not compensate for the energy lost in LC-tank 502. For example, if the relative phase is: $\Phi(V\omega_0) - \Phi(I\omega_0) = \pi$, the current delivered by active circuit 508 to LC-tank 502 represents a pure loss and is equivalently modeled as an impedance Zactive in parallel to LC-tank and whose expression is:

$$Zactive = \frac{V\omega_0}{I\omega_0} + j0.$$

This represents a positive pure resistance and does not compensate for the losses of LC-tank 502 (i.e., a negative pure resistance is desired to compensate for the losses).

If the current delivered by active circuit 508 to LC-tank 502 is 90° out of phase, which is represented by the relative phase:

$$\Phi(V\omega_0) - \Phi(I\omega_0) = \frac{\pi}{2},$$

a current delivered by active circuit 508 to LC-tank 502 represents a pure reactive component that does not produce any variation on the loss term of LC-tank 502 but alters the ratio of its reactive components. That is, the frequency is shifted but the energy of LC-tank 502 is not altered. For example, this results in a pure shift of the resonating frequency of VCO 500. This may be modeled as an impedance Zactive in parallel to LC-tank 502 of:

$$Zactive = 0 + j\frac{V\omega_0}{I\omega_0}.$$

The above represents a pure capacitive impedance, which does not compensate for the resistance losses of LC tank 502.

Also, if the relative phase is −90° out of phase, which is represented by the relative phase of:

$$\Phi(V\omega_0) - \Phi(I\omega_0) = -\frac{\pi}{2},$$

the current delivered by active circuit 508 to LC-tank 502 represents a pure reactive component that also does not produce any variation on the loss term of LC-tank 502 but alters the ratio of its reactive components. This again is a pure shift of the resonating frequency. This may be modeled as $$Z_{active} = 0 - j\frac{V\omega_0}{I\omega_0},$$

which is a pure inductive impedance, which does not compensate for the resistance losses of LC tank 502.

Any other relative phases that are mapped in the four phase quadrants can be equivalently represented as an impedance in parallel to LC-tank 502 with a real (positive or negative) and an imaginary (capacitive or inductive) part. The type of relative phase shift between $V\omega_0$ and $I\omega_0$ produces both a loss (or a reduction of loss) and a resonance frequency positive (or negative) shift. Because the negative resistance synthesized by active circuit 508 at the fundamental frequency is given by $$-R\omega_0 = \text{Re}\left[\frac{V\omega_0}{I\omega_0}\right],$$

a zero phase shift between $I\omega_0$ and $V\omega_0$ minimizes the current needed to synthesize the negative resistance (−R) needed to compensate for the loss in LC-tank 502, which maximizes the oscillation amplitude and the phase noise of VCO 500.

Accordingly, by inserting the current waveform in phase with the voltage, noise is reduced. The noise of active circuit 508 may be split into two orthogonal components: amplitude noise (AN) and phase noise (PN).

An active circuit that generates a train of current impulses with a period equal to $1/(2\pi\omega_0)$ and in phase with the voltage of LC-tank 502 produces less phase noise with respect to an active circuit that generates a train of current impulses with the same period but with a relative phase different from the voltage (i.e., different from 0). The source of noise when the current is in phase to voltage has a conduction angle (i.e., a portion of the time period in which active device 508 is on and generates noise) that is narrower and more concentrated around the voltage peaks of the voltage of LC-tank 502 with respect to a current that is out of phase with the voltage of LC-tank 502. Thus, if the noise is injected at the peak of the voltage of LC-tank 502, the phase of VCO 500 has a minimum sensitivity to the noise. However, if the noise is injected at the zero crossing of the voltage of LC-tank 502, VCO 500 is fully sensitive to the noise.

Figure 7:
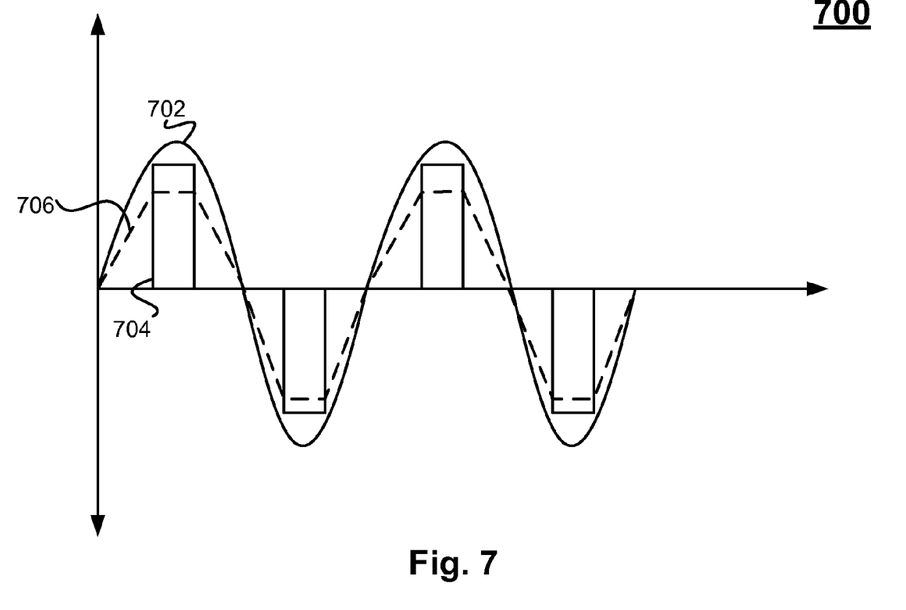
FIG. 7 shows a graph of the voltage and current waveforms according to one embodiment.

FIG. 7 shows a graph 700 of a voltage waveform 702 and a current waveform 704 according to one embodiment. Additionally, a current waveform 706 of a conventional 50% duty cycle is shown. Voltage waveform 702 is the voltage of the LC-tank 502. Current waveform 704 is narrow pulses introduced by particular embodiments. Conventional current waveform 706 is a conventional current that is introduced. Because current waveform 704 is introduced as narrow pulses, the current is concentrated around the peaks of voltage waveform 702. However, conventional current waveform 706 is wider and introduces current around the zero crossings of voltage waveform 702. More noise is introduced by conventional current waveform 706 than current waveform 704 as the current introduced towards the zero crossing introduces more noise than current that is concentrated around the peaks of voltage waveform 702. Thus, by having a narrow pulse, current waveform 704 introduces current in an area that introduces less noise into LC tank 502.

Referring back to FIG. 5, details of VCO 500 are shown according to one embodiment. A circuit for LC-tank 502 includes inductors 504a and 504b, and capacitor 506. Also, active circuit 508 includes a pair of cross-coupled transistors 802a (Mp) and 802b (Mn) and additional transistors 802c (M1) and 802d (M2). Transistors 802a-802d may be N-type transistors.

The sources of transistors Mp and Mn are coupled to the drains of transistors M1 and M2, respectively. Also, the gates of transistors Mp and M1 are coupled together as are the gates of transistors Mn and M2. A current source 804 (Ibias) is also coupled to the sources of transistors Mp and Mn and to the drains of transistors M1 and M2.

Transistors M1 and M2 turn on after transistors Mp and Mn, respectively. For example, transistors M1 and M2 include a threshold voltage (Vt1) that is higher than the threshold voltage of Mp and Mn (Vt2). The differences in threshold voltages between transistors Mp/Mn and transistors M1/M2 may be provided by the characteristics of transistors Mp/Mn and transistors M1/M2 or by shifting the bias point of transistors M1 and M2.

FIG. 5 shows an example where the difference in threshold voltages are provided by the characteristics of transistors Mp/Mn and transistors M1/M2. In a DC balanced condition (i.e., when oscillation has not yet started), transistors M1 and M2 are in the off condition while transistors Mp and Mn are on and conducting with a bias current equal to Ibias/2. This point is when the voltage at node Vp equals the voltage at node Vn. When oscillation starts and has reached its harmonic balance, the voltage at node Vp starts to go higher and the voltage at node Vn starts to go lower. At the point where the voltage at node Vp is higher than the voltage Vn but not yet higher than the threshold voltage Vt1, transistors M1 and M2 are off. The current is increasing in transistor Mn, which is on when the voltage at node Vp is higher than Vt2, and decreasing in transistor Mp. The sum of the currents in Mn and Mp is equal to Ibias.

When the voltage at node Vp becomes higher than the threshold voltage Vt1, transistor M2 turns on. This pulls node VCM to VSS while transistor M1 remains in the off condition. From this point, the current flowing into the transistor Mn starts increasing at a faster rate than before and also, the current into transistor Mp starts decreasing at a faster rate than before. The sum of the currents in the transistors Mn and Mp is now larger than Ibias. When the voltage at node Vp reaches its peak value, transistors Mn and M2 conduct a maximum current deliverable to node Vn. A maximum current is set by an operative condition of the series of the transistors Mn and M2 in the triode region.

The current is sinked out of the node Vn when the voltage at Vn is at its minimum value. Thus, the phase relationship between the voltage of LC-tank 502 and a pulse current through transistors Mn and M2 is in phase. The losses of LC-tank 502 are compensated as active circuit 508 acts as a negative resistance in parallel to LC-tank 502. As the voltage waveform oscillates, and the voltage at Vn becomes greater than Vp, the opposite of the above occurs because VCO 500 is symmetric.

Because transistor M1 turns on after transistor Mp or transistor M2 turns on after transistor Mn, the shape of the current is a narrower and taller shape in contrast to the conventional circuit of FIG. 3. Also, the current shape delivered to LC-tank 502 by active circuit 508 has a reduced conduction angle in contrast to a 50% conduction angle of the current delivered in the conventional circuit of FIG. 3. This results in a pulse-like shape rather than a square-like shape of the conventional current waveform.

Figure 8:
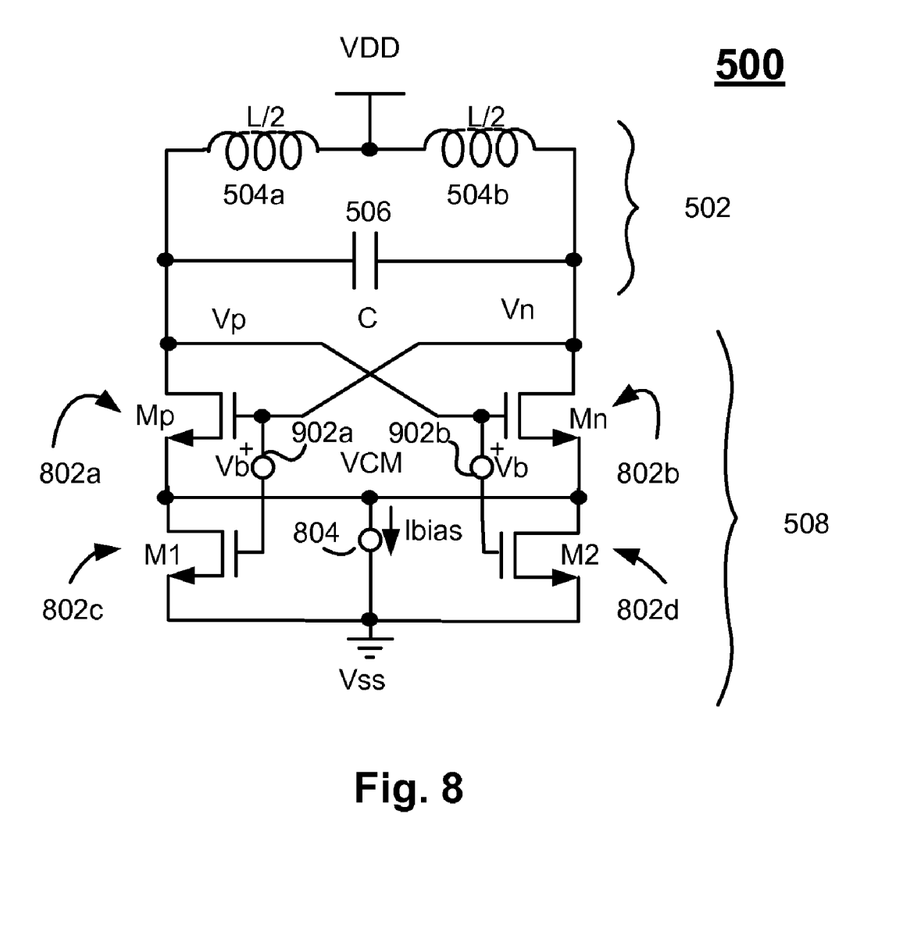
FIG. 8 depicts an example implementation of the VCO according to one embodiment.

An implementation of transistors M1 and M2 for shifting the bias point will now be described. FIG. 8 depicts another example of VCO 500 according to one embodiment. A DC shift in the operating point of transistors M1 and M2 may be used to cause transistors M1 or M2 to turn on after transistors Mp or Mn, respectively. A conceptual voltage shift (Vb) 902a and 902b may be inserted in between the gates of transistors Mp/M1 and transistors Mn/M2. The voltage shift Vb may be applied in series to the gates of transistors M1 and M2. As the voltage Vb is increased from 0 volts to positive higher voltages, the shape of the current becomes more pulse-like and narrower.

Figure 9:
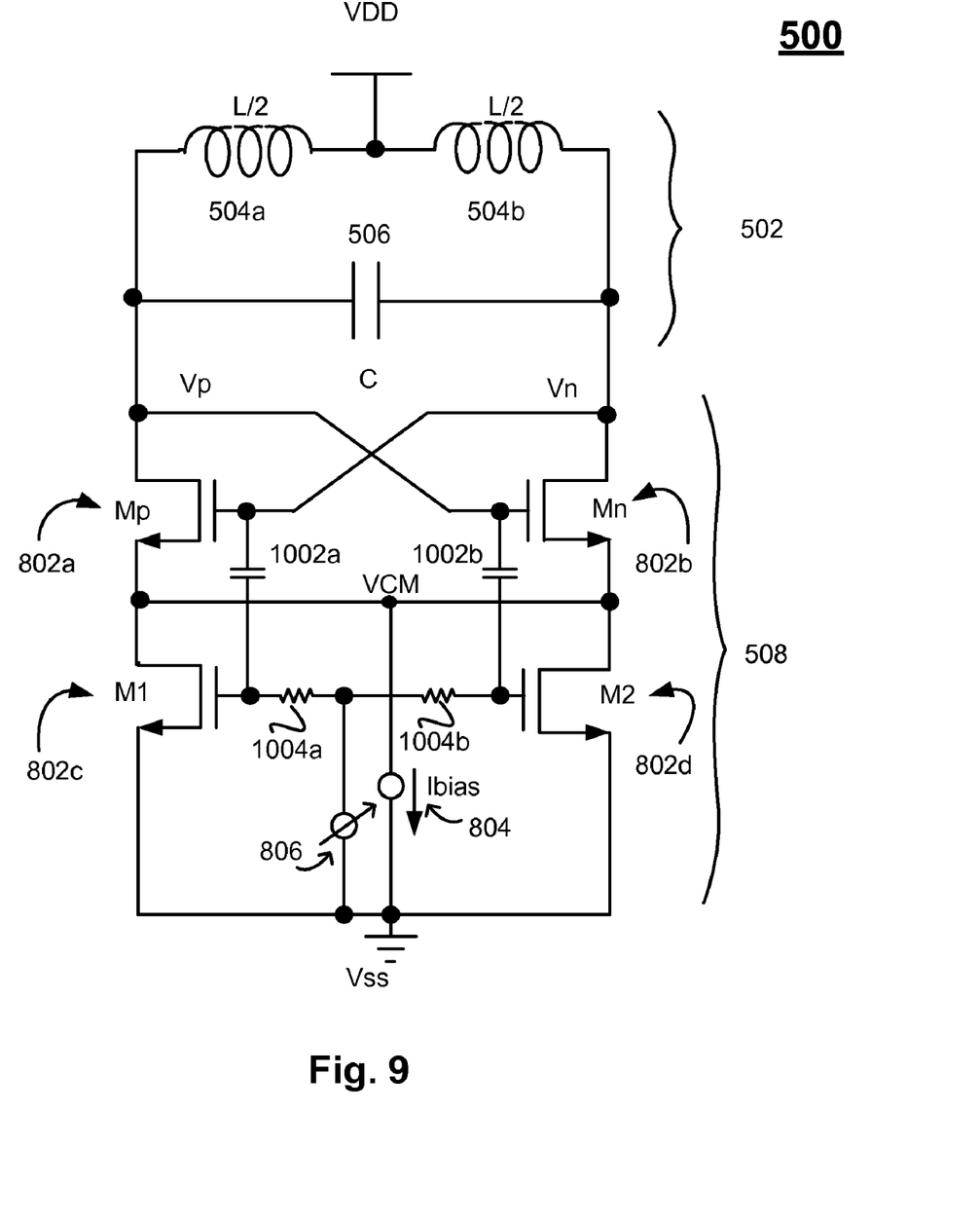
FIG. 9 shows another example implementation of the VCO according to one embodiment.

FIG. 9 shows an example implementation of voltage shift (Vb) as shown in FIG. 8 according to one embodiment. The voltage shift or bias voltage Vb is implemented using a regulated voltage source 806 and is used to shift the bias point of transistors M1 and M2 with respect to transistors Mp and Mn. A decoupling network including capacitors 1002a, 1002b and resistors 1004a, 1004b used to provide the bias voltage Vb for transistors M1 and M2. This shifts the bias point of transistors M1 and M2 such that transistors M1 and M2 turn on after transistors Mp and Mn. The regulated voltage source 806 may be implemented by using a pair of transistors in diode connection fed by a regulated current source.

Figure 10:
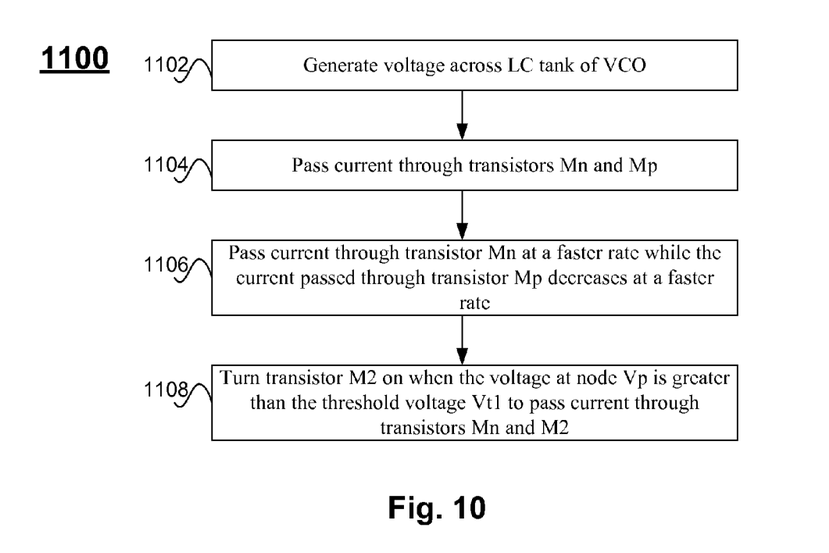
FIG. 10 depicts a simplified flowchart of a method for providing the VCO according to one embodiment.

FIG. 10 depicts a simplified flowchart 1100 of a method for providing VCO 500 according to one embodiment. The method is described with respect to a half period of the voltage waveform. At 1102, a voltage is generated across LC tank 502 of VCO 500. At 1104, a current is passed through transistors Mn and Mp. This is when oscillation has not started. At 1106, the voltage at node Vp, increases and the current passed through transistor Mn increases at a faster rate while the current through transistor Mp decreases at a faster rate.

At 1108, transistor M2 turns on when the voltage at node Vp is greater than the threshold voltage Vt1 to pass current through transistors Mn and M2. When Vp reaches its peak value, the current flowing through node Vn is set by the operative condition of the series of transistors Mn and M2 in the triode region.

Particular embodiments provide a better measure of a figure of merit (FOM). The figure of merit is a measure of the efficiency of the VCO at a given frequency offset from the fundamental frequency. The FOM calculates the ratio between the phase noise and the power consumption normalized to the offset frequency at which the phase noise is computed. The lower the figure of merit is better because the lower number means less power is needed to generate a harmonic oscillation at the given offset frequency with a given spectral purity or vice versa the phase noise is lower at a given offset frequency given a budget of power consumption. The formula for the figure of merit is:

$$\text{FoM}(\Delta f)=L(\Delta f)-20\log(f_0/\Delta f)+10\log(P_{diss}/1mW)$$

where:
$f_0$: resonant frequency
$\Delta f$: frequency offset from resonant frequency
$L(\Delta f)$: Phase noise (in dB) at a $\Delta f$ offset from resonant frequency Pdiss: Power dissipation of the LC-tank oscillator (in Watt)
A table shows simulation results for the conventional VCO 200 of FIG. 3 and VCO 500 of FIG. 5.

|  | Conventional VCO 200 | VCO 500 |
|---|---|---|
| Amplitude (Vp) | 1 V | 1 V |
| Current consumption (Ibias) | 10.2 mA | 8.5 mA |
| Phase Noise @ 20 MHz | −167.6 dBc/Hz | −169.3 dBc/Hz |
| FoM (defined in chapter 2) | −190 dB | −192.3 dB |

As shown, the phase noise at 20 MHz shows an improvement of −1.7 dBc/Hz and the figure of merit improves −2.3 dB. It can be shown that the 2.3 dB improvement in the FOM is 1.9 dB from the narrow pulse and 0.4 dB from the narrow pulse being injected in phase with the voltage where VCO 500 is less sensitive to the phase noise.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A voltage controlled oscillator (VCO) comprising:
a tank circuit;
a first pair of transistors each having a gate, drain, and a source, wherein the drains of the first pair of transistors are coupled to the tank circuit, wherein the gates of the first pair of transistors are cross-coupled with the drains of the first pair of transistors, the first pair of transistors each having a first threshold voltage; and
a second pair of transistors each having a gate, drain, and a source, wherein the drains of the second pair of transistors are respectively coupled to the sources of the first pair of transistors and the gates of the second pair of transistors are respectively coupled to the gates of the first pair of transistors, the second pair of transistors each having a second threshold voltage higher than the first threshold voltage.

2. The VCO of claim 1, further comprising a current source coupled to the sources of the first pair of transistors and drains of the second pair of transistors.

3. The VCO of claim 1, wherein at substantially around a zero crossing of a voltage waveform of the tank circuit, the first pair of transistors are on and the second pair of transistors are off.

4. The VCO of claim 3, wherein when the voltage waveform of the tank circuit is higher than the second threshold voltage, one of the second pair of transistors turns on.

5. The VCO of claim 4, wherein a current through the one of the second pair of transistors and one of the first pair of transistors is at a peak when the one of the second pair of transistors and one of the first pair of transistors are operating in a triode condition.

6. The VCO of claim 4, wherein a sum of current flowing through the first pair of the transistors is greater than a bias current being supplied by a current source.

7. The VCO of claim 1, further comprising:
   a first bias voltage circuit coupled to the gate of a first transistor of the first pair of transistors and the gate of a first transistor of the second pair of transistors; and
   a second bias voltage circuit coupled to the gate of a second transistor of the first pair of transistors and the gate of a second transistor of the second pair of transistors.

8. The VCO of claim 7, wherein the first bias voltage circuit comprises a first capacitor coupled to the gate of the first transistor of the first pair of transistors and the gate of the first transistor of the second pair of transistors, wherein the second bias voltage circuit comprises a second capacitor coupled to the gate of the second transistor of the first pair of transistors and the gate of second transistor of the second pair of transistors,
   wherein the first bias voltage circuit further comprises a first resistor coupled to the gate of the first transistor of the first pair of transistors and to a second resistor, the second resistor coupled to the gate of the second transistor of the second pair of transistors.

9. The VCO of claim 7, wherein the first bias voltage circuit and the second bias voltage circuit shift a bias voltage for the second pair of transistors such that the second threshold voltage is higher than the first threshold voltage.

10. The VCO of claim 1, wherein the first threshold voltage is a first characteristic of the first pair of transistors and the second threshold voltage is a second characteristic of the second pair of transistors.

11. The VCO of claim 1, wherein the tank circuit comprises an inductor and capacitor.

12. The VCO of claim 1, wherein a current sourced or sinked to the tank circuit is in phase with a voltage of the tank circuit.

* * * * *